United States Patent
Park et al.

(10) Patent No.: US 8,267,103 B2
(45) Date of Patent: Sep. 18, 2012

(54) METHOD AND APPARATUS FOR CLEANING SUBSTRATES

(75) Inventors: Keun-Young Park, Chungcheongnam-do (KR); Kyo-Woog Koo, Chungcheongnam-do (KR)

(73) Assignee: Semes Co. LTD, Chungcheongnam-Do (KR)

(*) Notice: Subject to any disclaimer, the term of this patent is extended or adjusted under 35 U.S.C. 154(b) by 1077 days.

(21) Appl. No.: 11/796,885

(22) Filed: Apr. 30, 2007

(65) Prior Publication Data

US 2007/0283983 A1  Dec. 13, 2007

(30) Foreign Application Priority Data

Jun. 12, 2006 (KR) .................. 10-2006-0052665
Jun. 20, 2006 (KR) .................. 10-2006-0055358

(51) Int. Cl.
*B08B 3/00* (2006.01)
(52) U.S. Cl. ................ 134/200; 134/902
(58) Field of Classification Search ............... None
See application file for complete search history.

(56) References Cited

U.S. PATENT DOCUMENTS

| | | | | |
|---|---|---|---|---|
| 5,571,560 A * | 11/1996 | Lin | ............... | 427/240 |
| 6,332,909 B1 * | 12/2001 | Teshima et al. | ............... | 75/401 |
| 6,869,234 B2 * | 3/2005 | Sanada et al. | ............... | 396/604 |
| 7,323,080 B2 | 1/2008 | Kim et al. | | |
| 7,608,152 B2 | 10/2009 | Miya et al. | | |
| 2004/0082251 A1 * | 4/2004 | Bach et al. | ............... | 445/60 |
| 2005/0247667 A1 * | 11/2005 | Kim et al. | ............... | 216/57 |
| 2005/0276921 A1 * | 12/2005 | Miya et al. | ............... | 427/240 |
| 2006/0033678 A1 * | 2/2006 | Lubomirsky et al. | ............... | 345/32 |

FOREIGN PATENT DOCUMENTS

| | | |
|---|---|---|
| JP | 55096945 | 7/1980 |
| JP | 57023937 | 2/1982 |
| JP | 1055995 | 3/1989 |
| JP | 03-131026 | 6/1991 |
| JP | 10-106999 | * 4/1998 |
| JP | 10106999 | 4/1998 |
| JP | 10-172880 | 6/1998 |
| JP | 2003037095 | 2/2003 |
| KR | 2002-0091819 | 12/2002 |
| KR | 1020020091819 A | 12/2002 |

OTHER PUBLICATIONS

Korean Patent Registration No. 10-0715984 for Apparatus and Methods for Treating Substrate, 2008.

* cited by examiner

*Primary Examiner* — Michael Barr
*Assistant Examiner* — Jason Ko
(74) *Attorney, Agent, or Firm* — Jenkins, Wilson, Taylor & Hunt, P.A.

(57) ABSTRACT

Provided is an apparatus for cleaning and drying a substrate by applying a plurality of chemicals and gases to the substrate. The apparatus may include: a substrate support member including a chuck receiving a substrate; a first nozzle member injecting a drying fluid onto a top surface of the substrate for drying the substrate; a low cover including an opened top and enclosing the chuck; and an upper cover selectively closing the opened top of the low cover so as to dry the substrate in a closed space. Therefore, the apparatus dries a substrate more efficiently and protects the substrate from being contaminated by foreign pollutants. Furthermore, generation of an undesired oxidation layer on the substrate can be prevented.

27 Claims, 11 Drawing Sheets

METHOD AND APPARATUS FOR CLEANING SUBSTRATES

CROSS-REFERENCE TO RELATED APPLICATIONS

This U.S. non-provisional patent application claims priority under 35 U.S.C. §119 of Korean Patent Application Nos. 2006-52665, filed on Jun. 12, 2006, and 2006-55358, filed on Jun. 20, 2006, the entire contents of which are hereby incorporated by reference.

BACKGROUND OF THE INVENTION

The present invention disclosed herein relates to an apparatus for cleaning substrates, and more particularly, to a method and apparatus for cleaning and drying substrates by applying a plurality of chemicals and gases to the substrates.

In a conventional semiconductor manufacturing method, deposition of an insulation layer and a metal layer, etching, coating with photoresist, development, removal of ashes, and other processes are repeated several times to form arrays of fine patterns. Furthermore, in the conventional semiconductor manufacturing method, a wet cleaning process is performed using deionized water or a chemical to remove foreign substances remaining after each process.

In a conventional cleaning apparatus, a chemical or deionized water is applied to a top surface of a wafer fixed by a wafer chuck while rotating the fixed wafer using a motor. The chemical or deionized water applied to the top surface of the wafer is spread on the entire top surface of the wafer by a centrifugal force.

In such a single wafer type cleaning apparatus, N2 gas is used to dry a wafer after rinsing the wafer using deionized water.

However, the deionized water used in the rinsing process can remain after the N2-gas drying process. This problem occurs more frequently as wafers increase in size and are formed with much finer patterns. Furthermore, since wafers are cleaned and dried in the atmosphere, the wafers can be easily damaged by environmental agents.

SUMMARY OF THE INVENTION

The present invention provides a method and apparatus for rapidly cleaning and drying substrates.

The present invention also provides a method and apparatus for cleaning substrates while protecting the substrates from external pollutants.

The present invention further provides a substrate cleaning method and apparatus that can reduce generation of water spots on the substrates during a drying process.

The present invention further provides a substrate cleaning method and apparatus that can effective protect substrates from being affected by environmental agents during a process.

The present invention further provides a substrate cleaning method and apparatus that can prevent outside air from being introduced into a space in which a substrate is treated.

Embodiments of the present invention provide apparatuses for cleaning a substrate, the apparatuses including: a substrate support member including a chuck receiving a substrate; a first nozzle member injecting a drying fluid onto a top surface of the substrate for drying the substrate; a low cover including an opened top and enclosing the chuck; and an upper cover selectively closing the opened top of the low cover so as to dry the substrate in a closed space.

In some embodiments, the apparatus further includes a decompression unit used to decompress the closed space formed by the low cover and the upper cover.

In other embodiments, the apparatus further includes a first rotation unit rotating the first nozzle member.

In still other embodiments, the first nozzle member includes a nozzle including a plurality of injection holes along a horizontal line running from center to edge of the substrate.

In even other embodiments, the apparatus further includes a lifting unit moving the upper cover to or away from the low cover for closing or opening the opened top of the low cover.

In yet other embodiments, the first nozzle member includes a nozzle that includes an injection hole and is disposed in the closed space above the substrate.

In further embodiments, the apparatus further includes a first rotation unit rotating the first nozzle member.

In still further embodiments, the first nozzle member is formed at the upper cover.

In even further embodiments, the apparatus further includes a first rotation unit rotating the upper cover.

In yet further embodiments, the nozzle includes a plurality of injection holes along a horizontal line running from center to edge of the substrate.

In yet further embodiments, hole area density of the injection holes increases in a direction from the center to the edge of the substrate.

In yet further embodiments, the chuck includes support members that support the substrate and space the substrate apart from a top surface of the chuck.

In yet further embodiments, the apparatus further includes a second nozzle member installed at the chuck for injecting a fluid onto a bottom surface of the substrate.

In yet further embodiments, the substrate support member further includes a second rotation unit rotating the chuck.

In yet further embodiments, the drying fluid includes an organic solvent and nitrogen gas.

In other embodiments of the present invention, there are provided methods of cleaning a substrate, the methods including: loading a substrate on a chuck disposed in a low cover; supplying a chemical to the substrate so as to treat the substrate; and after isolating a space in which the substrate is placed, supplying a drying fluid to the substrate so as to dry the substrate.

In some embodiments, the supplying of the drying fluid is performed at a pressure lower than the atmospheric pressure.

In other embodiments, the supplying of the chemical is performed while rotating the chuck.

In still other embodiments, the supplying of the chemical is performed after opening a top of the low cover.

In even other embodiments, the supplying of the drying fluid is performed after closing an opened top of the low cover using an upper cover.

In yet other embodiments, the drying fluid is supplied to the substrate through a nozzle installed to the upper cover.

In further embodiments, the supplying of the drying fluid is performed while rotating at least one of the chuck and the nozzle.

In still further embodiments, the drying fluid is supplied to the substrate after closing an opened top of the low cover using an upper cover to isolate the space in which the substrate is placed and decompressing the isolated space.

In still other embodiments of the present invention, there are provided apparatuses for cleaning a substrate, the apparatuses including: a substrate support member including a chuck receiving a substrate and a spindle supporting the chuck; and a chamber providing a closed space in which the chuck is placed and including a first spindle hole through which the spindle passes, wherein the chamber includes first and second sealing members installed at different heights so as to form a buffer space between the spindle and the first spindle hole.

In some embodiments, the apparatus further includes: a first decompression unit decompressing the closed space to a first pressure lower than the atmospheric pressure; and a second decompression unit decompressing the buffer space formed between the first and second sealing members to a second pressure lower than the atmospheric pressure.

In other embodiments, the second pressure of the buffer space is lower than the first pressure of the closed space so as to prevent outside air from being introduced into the closed space.

In still other embodiments, the first and second sealing members are bearings.

In even other embodiments, the chamber further includes: a low cover having an opened top; and an upper cover closing the opened top of the low cover so as to treat the substrate in a closed space.

In yet other embodiments, the apparatus further includes a lifting unit moving the upper cover for opening or closing the opened top of the low cover.

In further embodiments, the apparatus further includes a first nozzle member including a nozzle formed with an injection hole for injecting a drying fluid onto a top surface of the substrate for drying the substrate, wherein the nozzle is disposed in the closed space above the substrate.

In still further embodiments, the apparatus further includes a first nozzle member including a spindle and a nozzle supported by the spindle, the nozzle being formed with an injection hole for injecting a drying fluid onto a top surface of the substrate for drying the substrate and a spindle supporting the nozzle, wherein the nozzle is disposed in the closed space above the substrate, and the chamber further includes: a second spindle hole through which the spindle of the first nozzle member passes; and third and fourth sealing members installed at different heights to provide dual sealing for a space between the spindle of the first nozzle member and the second spindle hole.

In even other embodiments of the present invention, there are provided apparatuses for cleaning a substrate, the apparatuses including: a substrate Support member including a chuck receiving a substrate and a spindle supporting the chuck; a first nozzle member including a nozzle injecting a drying fluid onto a top surface of the substrate for drying the substrate and a spindle supporting the nozzle, a low cover including an opened top and enclosing the chuck; an upper cover selectively closing the opened top of the low cover so as to dry the substrate in a closed space; and a decompression unit used to decompress the closed space formed by the low cover and the upper cover, wherein the low cover includes a first spindle hole through which the spindle of the substrate support member passes and first and second sealing members installed at different heights to provide dual sealing for a space between the spindle of the substrate support member and the first spindle hole, and the upper cover includes a second spindle hole through which the spindle of the first nozzle member passes and third and fourth sealing members installed at different heights to provide dual sealing for a space between the spindle of the first nozzle member and the second spindle hole.

In some embodiments, the decompression unit decompresses the closed space to a first pressure lower than the atmospheric pressure, and the apparatus further includes another decompression unit decompressing a buffer space formed between the first and second sealing members and a buffer space formed between the third and fourth sealing members to a second pressure lower than the atmospheric pressure.

In other embodiments, the second pressure of the buffer spaces is lower than the first pressure of the closed space so as to prevent outside air from being introduced into the closed space.

In yet other embodiments of the present invention, there are provided apparatuses for cleaning a substrate, the apparatuses including: a chamber providing a closed space and including first and second spindle holes; a first nozzle member rotatably installed at an upper portion of the closed space through the first spindle hole; a substrate support member rotatably installed at a lower portion of the closed space through the second spindle hole; first and second sealing members forming a buffer space by dually sealing a space between the substrate support member and the second spindle hole; third and fourth sealing members forming a buffer space by dually sealing a space between the first nozzle member and the first spindle hole; and a decompression unit adjusting pressures of the closed space and buffer spaces to different levels so as to prevent outside air from being introduced into the closed space.

In some embodiments, the pressures of the buffer spaces are adjusted to be lower than that of the closed space.

In further embodiments of the present invention, there are provided methods of cleaning a substrate using a substrate cleaning apparatus including spindle holes through which a spindle of a chuck and a spindle of a first nozzle member are inserted and sealing members providing dual sealing for inner spaces of the spindle holes, the methods including: loading a substrate on the chuck disposed in a low cover; and after isolating a space in which the substrate is placed, drying the substrate by supplying a drying fluid to the substrate, wherein the drying of the substrate includes: decompressing the isolated space to a first pressure lower than the atmospheric pressure before supplying the drying fluid; and decompressing buffer spaces formed between the sealing members to a second pressure lower than the first pressure.

In some embodiments, the drying of the substrate is performed while rotating the chuck.

In other embodiments, the drying fluid is supplied to the substrate through a nozzle of a first nozzle member disposed at an upper portion of the isolated space.

In still other embodiments, the drying of the substrate is performed while rotating at least one of the chuck and the nozzle.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
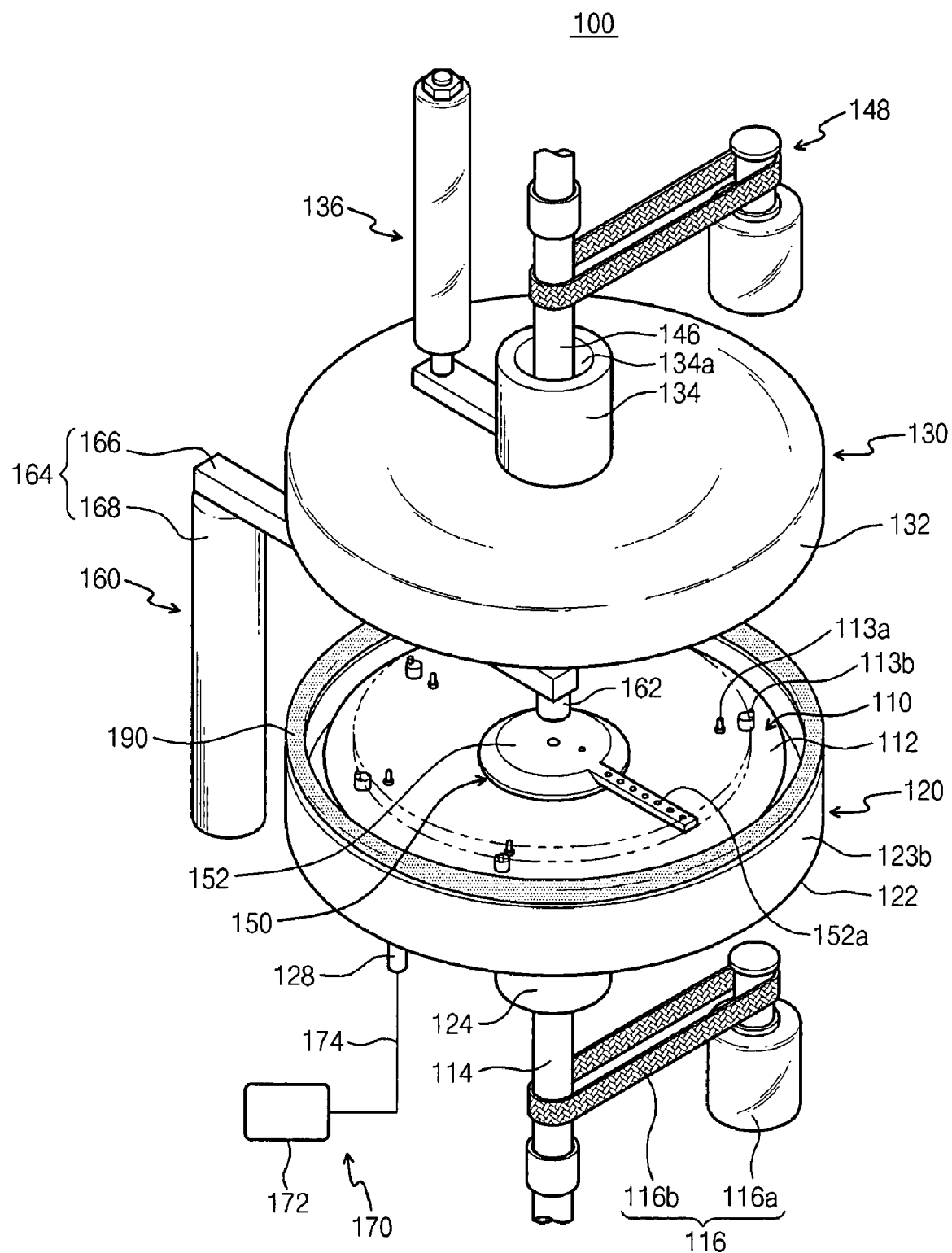
FIG. 1 is a schematic perspective view illustrating a substrate cleaning apparatus according to a first embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration.

Hereinafter, it will be described about exemplary embodiments of the present invention in conjunction with FIGS. 1 through 11. In FIGS. 1 through 11, like reference numerals denote like elements.

The present invention provides a substrate cleaning apparatus that can clean and dry substrates more efficiently and protect substrates from external pollutants and oxidation. For this purpose, the substrate cleaning apparatus of the present invention dries a substrate in an isolated chamber at a pressure lower than the atmospheric pressure. The chamber is formed by an upper cover and a low cover, and a decompression unit is used to decompress the chamber.

Figure 2:
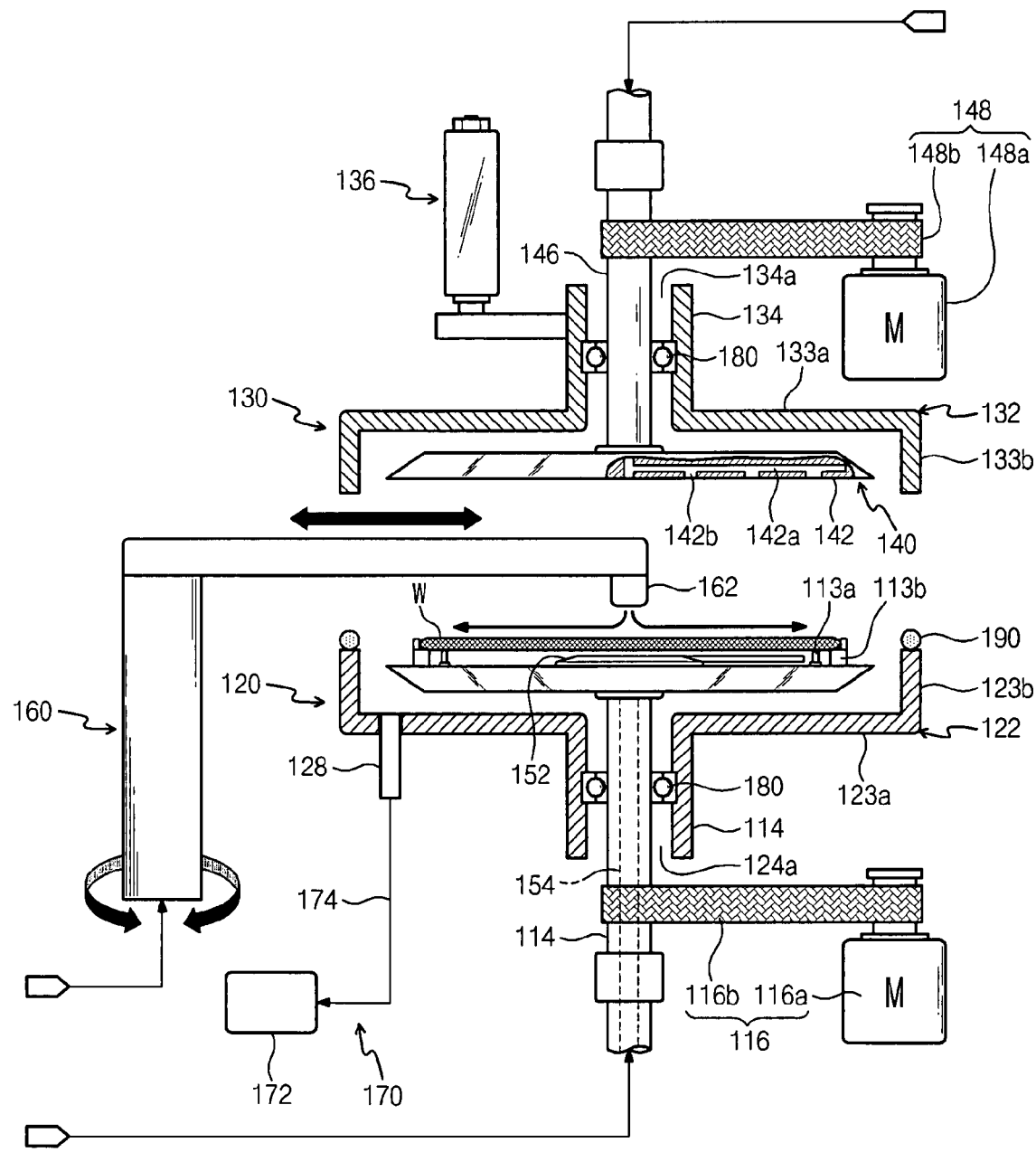
FIG. 2 illustrates the substrate cleaning apparatus when a low cover assembly of the substrate cleaning apparatus is opened according to the first embodiment of the present invention.

FIG. 1 is a schematic perspective view illustrating a substrate cleaning apparatus 100 according to a first embodiment of the present invention; FIG. 2 illustrates the substrate cleaning apparatus 100 when a low cover assembly of the substrate cleaning apparatus 100 is opened according to the first embodiment of the present invention; and FIG. 3 illustrates the substrate cleaning apparatus 100 when the low cover assembly is closed according to the first embodiment of the present invention.

Figure 3:
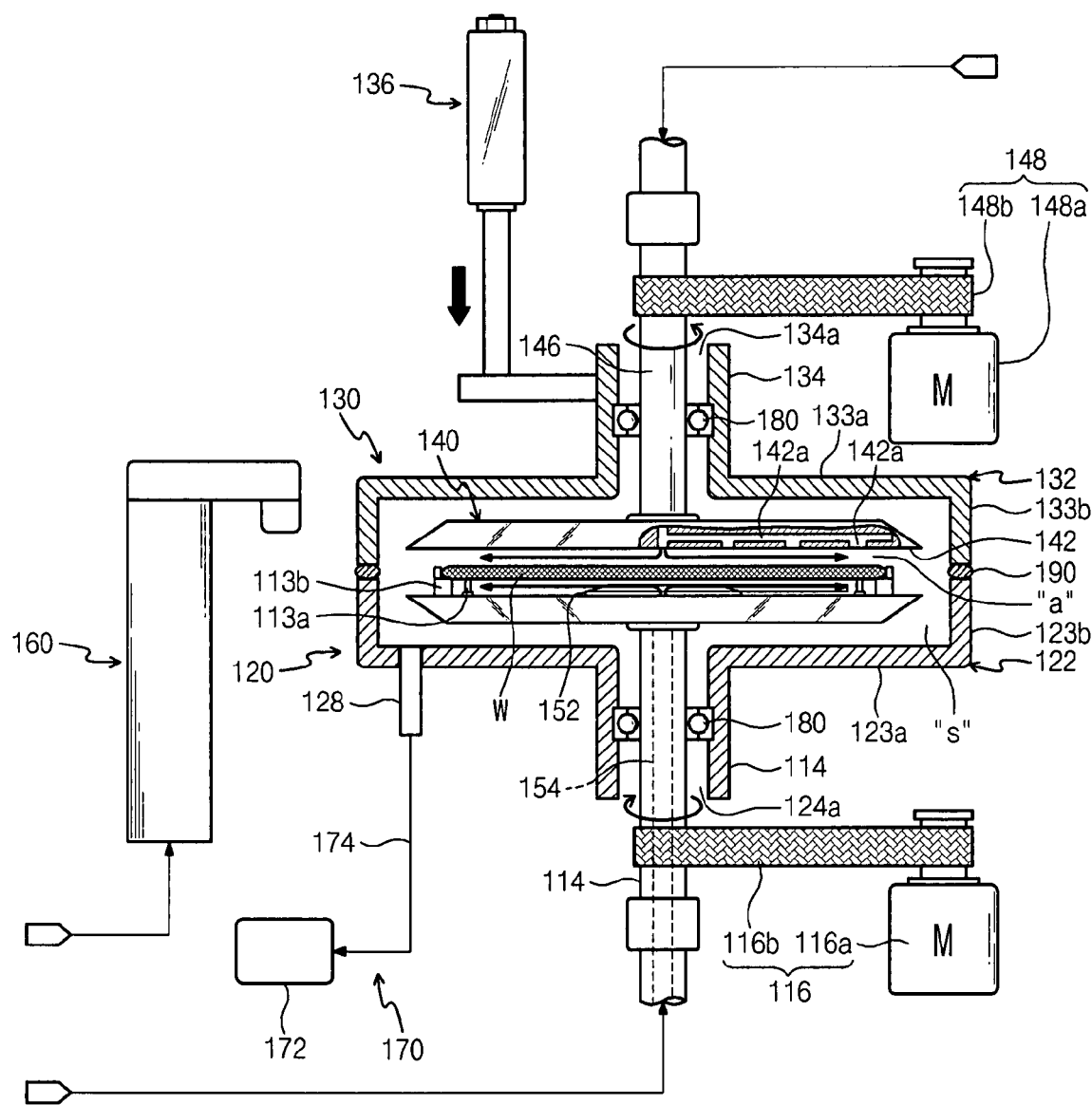
FIG. 3 illustrates the substrate cleaning apparatus when the low cover assembly is closed according to the first embodiment of the present invention.

Referring to FIGS. 1 through 3, the substrate cleaning apparatus 100 performs chemical cleaning, rinsing, and drying on a substrate (W) while spinning the substrate (W). The substrate cleaning apparatus 100 includes a substrate support member 110 having a chuck 112 to receive a substrate (W), a low cover member 120, an tipper cover member 130, a first nozzle member 140, a second nozzle member 150, a third nozzle member 160, and a decompression unit 170.

The substrate support member 110 supports a substrate (W) when the substrate (W) is treated. The substrate support member 110 includes the chuck 112, a spindle 114, and a second rotation unit 116.

The chuck 112 is disposed inside the low cover member 120. The chuck 112 includes a top surface receiving a substrate (W), support pins 113a supporting the substrate (W) off the top surface, and chucking pins 113b fixing the substrate (W). The support pins 113a supports the substrate (W) and spaces the substrate (W) apart from the top surface of the chuck 112, and the chucking pins 113b holds the substrate (W) by the edge when the substrate (W) is treated.

The spindle 114 of the substrate support member 110 is coupled to a bottom center of the chuck 112. The spindle 114 is coupled to the chuck 112 through an insertion port 124 of the low cover member 120. The spindle 114 receives rotary power from the second rotation unit 116. The chuck 112 is rotated by receive a rotary force from the second rotation unit 116 through the spindle 114.

The second rotation unit 116 may include a driver 116a such as a motor and a power transmitting member 116b such as a belt and a chain transmitting rotary power from the driver 116a to the spindle 114.

The low cover member 120 includes a low cup 122 enclosing the chuck 112 and having an opened top. The low cup 122 is shaped like a bowl. The low cup 122 includes a bottom surface 123a and a side surface 123b. The low cup 122 further includes the insertion port 124 and a vacuum port 128. The insertion port 124 is protruded downward from the bottom surface 123a of the low cup 122 and formed with a passage 124a. The vacuum port 128 is connected to a vacuum line 174 of the decompression unit 170. The spindle 114 of the substrate support member 110 passes through the passage 124a of the insertion port 124, and a bearing 180 is installed in the passage 124a to rotatably support the spindle 114 and hermetically seal the passage 124a. The low cover member 120 may further include a discharge hole (not shown) to drain a chemical or other fluids.

The upper cover member 130 includes an upper cup 132 and a lifting unit 136. The lifting unit 136 lifts or moves down the upper cup 132 to open or close the top of the low cover member 120. The upper cup 132 is shaped like a bowl. The upper cup 132 includes a top surface 133a and a side surface 133b. The top surface 133a is sufficiently large to cover the top of the low cup 122, and the side surface 133b extends downward from the edge of the top surface 133a. The upper cup 132 further includes an insertion port 134. The insertion port 134 is protruded upward from the top surface 133a and formed with a passage 134a. The side surface 133b of the upper cup 132 makes contact with the side surface 123b of the low cup 122 when the upper cup 132 is moved down. A sealing member 190 is attached to the side surface 123b of the low cup 122 to hermetically seal a space closed by the upper and low cups 132 and 122 when a substrate (W) is treated in the space. A spindle 146 of the first nozzle member 140 passes through the passage 134a of the insertion port 134, a bearing 180 is installed in the passage 134a to rotatably support the spindle 146 and hermetically seat the passage 134a.

The decompression unit 170 decompresses a closed space (s) formed by upper and low cups 132 and 122. The decompression unit 170 includes a vacuum pump 172 and the vacuum line 174. One end of the vacuum line 174 is connected to the vacuum pump 172, and the other end is connected to the vacuum port 128 of the low cover member 120.

As explained above, the substrate cleaning apparatus 100 of the present invention is characterized in that a substrate (W) can be treated in an isolated space (the closed space (s)) by closing the upper cover member 130 and the closed space (s) can be decompressed to a pressure lower than the atmospheric pressure. Therefore, the substrate cleaning apparatus 100 can rapidly dry a substrate while more effectively protecting the substrate from environmental agents.

Although not shown, the low cover member 120 and the chuck 112 of the substrate support member 110 can be moved individually or relative to each other. In this case, a substrate (W) can be loaded on or unloaded from the chuck 112 after moving the low cover member 120 or the chuck 112 to an appropriate position.

Referring to FIGS. 1 and 2, the third nozzle member 160 is used to inject a cleaning fluid onto a top surface of a substrate (W). The third nozzle member 160 includes a nozzle 162. A nozzle moving member 164 moves the nozzle 162 vertically or rotates the nozzle 162 from a center of a substrate (W) to the edge of the low cup 122. The nozzle moving member 164 includes a horizontal support member 166 connected to the nozzle 162 and a vertical support member 168 connected to the horizontal support member 166. The vertical support member 168 can be rotated by a motor (not shown).

Referring to FIGS. 2 and 3, the second nozzle member 150 is used to selectively inject cleaning and drying fluids onto a bottom surface of a substrate (W). The second nozzle member 150 includes a nozzle 152 on the chuck 112 and a supply line 154 supplying a fluid to the nozzle 152. The supply line 154 is connected to the nozzle 152 through the spindle 114 of the substrate support member 110. The nozzle 152 includes a bar. The bar extends in a radial direction of the substrate (W) and includes a plurality of injection holes 152a formed in a top surface.

Figure 4:
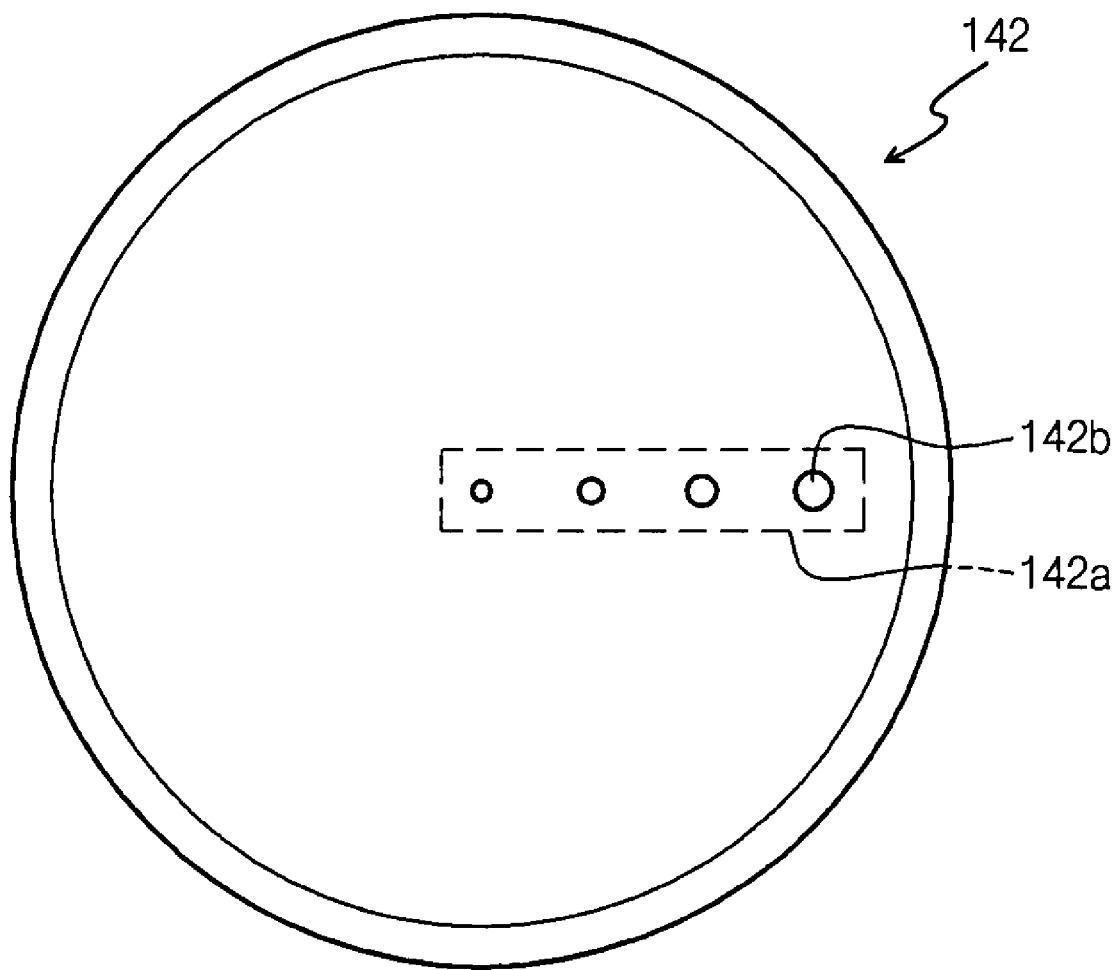
FIG. 4 illustrates injection holes formed in a nozzle of an upper cover assembly of the substrate cleaning apparatus according to the first embodiment of the present invention.

Referring to FIGS. 1 and 4, the first nozzle member 140 is used to inject a fluid onto a top surface of a substrate (W) for drying the substrate (W). The first nozzle member 140 includes a nozzle 142, the spindle 146, and a first rotation unit 148.

The nozzle 142 has a circular plate shape. The nozzle 142 includes an internal fluid passage 142a to receive a fluid from a fluid supplying unit for drying a substrate (W), and a plurality of injection holes 142b connected to the fluid passage 142a. A fluid for drying a substrate (W) is supplied to the fluid passage 142a through a supply line (not shown) formed through the spindle 146. The injection holes 142b are formed in the nozzle 142 at regular intervals along a horizontal line defined from center to edge of a substrate (W). The hole area density of the injection holes 142b may increase from the center to the edge of a substrate (W).

For this, the sizes of the injection holes 142b can be increased from the center to the edge of a substrate (W) as shown in FIG. 4. Alternatively, the distance between the injection holes 142b can be decreased as it goes from the center to the edge of a substrate (W). The drying fluid may include an organic solvent such as iso propyl alcohol (IPA) and nitrogen gas. The organic solvent and nitrogen gas can be heated to a temperature of 30° C. to 90° C. for being used as the drying fluid.

In the first nozzle member 140, the spindle 146 is coupled to a top center portion of the nozzle 142. The spindle 146 is coupled to the nozzle 142 through the insertion port 134 of the upper cover member 130. The spindle 146 receives rotary power from the external first rotation unit 148. The nozzle 142 injects a drying fluid onto a top surface of a substrate (W) while being rotated by rotary power transmitted from the first rotation unit 148 through the spindle 146.

The first rotation unit 148 is constructed to rotate the nozzle 142. The first rotation unit 148 includes a driver 148a such as a motor and a power transmitting member 148b such as a belt and a chain. The power transmitting member 148b transmits rotary power from the driver 148a to the spindle 146. The first rotation unit 148 can rotate the nozzle 142 of the first nozzle member 140 at a speed different from the rotation speed of the chuck 112.

As shown in FIG. 2, the nozzle 142 of the first nozzle member 140 may be spaced apart from a top surface of a substrate (W) by 0.1 mm to 10 mm when the substrate (W) is dried. When the nozzle 142 of the first nozzle member 140 is placed closer to the top surface of the substrate (W), the substrate (W) can be cleaned and dried more efficiently by the capillary phenomenon. However, when the nozzle 142 is spaced apart from the top surface of the substrate (W) by less than 0.1 mm, the substrate (W) can be scratched by the nozzle 142 because of tolerance accumulation of parts and bending of the substrate (W). On the other hand, when the nozzle 142 is spaced apart from the top surface of the substrate (W) by more than 10 mm, the substrate (W) is not efficiently dried.

As explained above, in the substrate cleaning apparatus 100, the nozzle 142 of the first nozzle member 140 forms a confined upper region (a) above a substrate (W) loaded on the chuck 112. When a heated drying fluid is supplied to the top surface of the substrate (W) through the confined upper region (a), the temperature of the drying fluid is not readily decreased. Particularly, since the heated drying fluid is supplied to many points of the substrate (W) through the plurality of injection holes 142b, the substrate (W) can be dried more rapidly and efficiently. Meanwhile, although a small amount of heated drying fluid including an organic solvent is supplied to the top surface of the substrate (W), the organic solvent can be distributed densely and uniformly throughout the confined upper region (a), thereby ensuring sufficient drying efficiency.

Furthermore, the velocity of drying fluid in the confined upper region (a), which is proportional to the rotation speeds of the nozzle 142 of the first nozzle member 140 and the substrate (W), can be further increased since the confined upper region (a) is narrow. Therefore, foreign particles and water remaining on the substrate (W) can be removed more efficiently.

As mentioned above, in the substrate cleaning apparatus 100, the number of injection holes and the kind of drying fluid can be varied according to the method of cleaning and drying a substrate. Furthermore, the distance between the injection holes can be varied according to the substrate cleaning and drying method. For example, a mixture of deionized water and a hydrofluoric solution, or a mixture of deionized water, an ammonia solution, and a peroxide solution can be used as a cleaning fluid in the substrate cleaning apparatus 100, and a mixture of iso propyl alcohol vapor and nitrogen gas, or nitrogen gas can be used as a drying fluid in the substrate cleaning apparatus 100.

A method of cleaning substrate using the substrate cleaning apparatus 100 will now be described.

Figure 5:
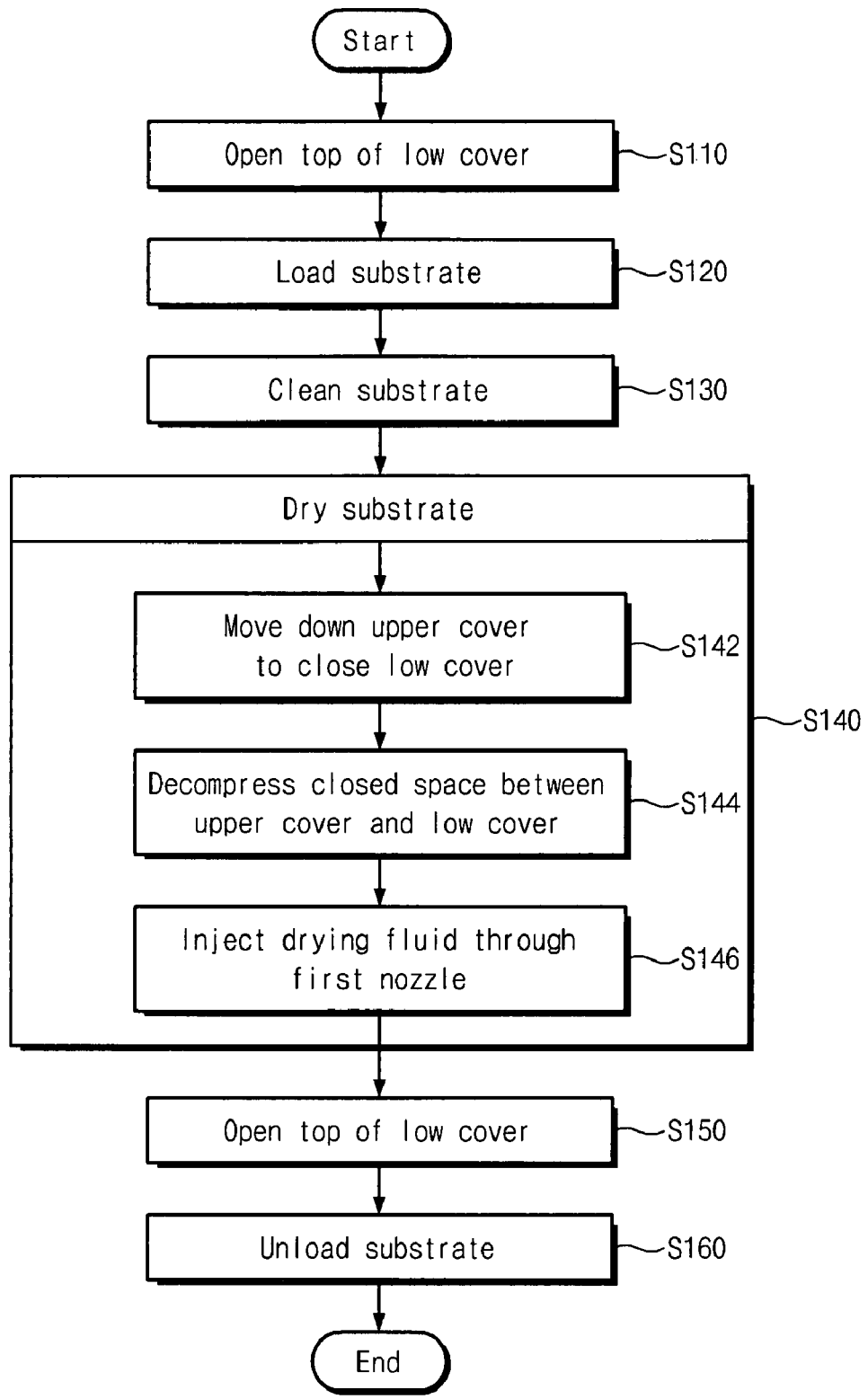
FIG. 5 is a flowchart for explaining a substrate cleaning method according the first embodiment of the present invention.

FIG. 5 is a flowchart for explaining a substrate cleaning method according the first embodiment of the present invention.

Referring to FIGS. 2, 3, and 5, a substrate (W) is loaded on the chuck 112 from the opened top of the low cover member 120 in operations S110 and S120. The substrate (W) is supported by the support pins 113a and chucked by the chucking pins 113b. The substrate (W) is rotated together with the chuck 112 by the second rotation unit 116. In operation S130, while the substrate (W) is rotated, a fluid is injected from the nozzle 162 of the third nozzle member 160 onto the substrate (W) to clean and rinse the substrate (W) (refer to FIG. 2).

After that, the substrate (W) is dried in operation S140. The substrate (W) is rapidly dried at a pressure lower than the atmospheric pressure to prevent formation of a water spot on the substrate (W).

In detail, the drying operation S140 is performed as follows. In sub-operation S142, the upper cup 132 of the upper cover member 130 is moved down to a position shown in FIG. 3 to close the opened top of the low cover member 120. In sub-operation S144, the decompression unit 170 decompresses the closed space (s) formed by the low cover member 120 and the upper cover member 130 to a pressure lower than the atmospheric pressure. In sub-operation S146, the substrate (W) is dried by injecting a dry fluid to the substrate (W) through the nozzle 142 of the first nozzle member 140. Here, the drying fluid is injected to the confined upper region (a) from the nozzle 142 while rotating the nozzle 142. In detail, while the nozzle 142 is rotated by the first rotation unit 148, the drying fluid is injected from the nozzle 142 toward the top surface of the substrate (W). Thus, the drying fluid can be rapidly spread to the edge of the substrate (W) by the centrifugal force. When the drying fluid is injected to the substrate (W), the chuck 112 and the nozzle 142 of the first nozzle member 140 can be rotated at different speeds (alternatively, only one of the chuck 112 and the nozzle 142 can be rotated). The amount of the drying fluid injected into the confined upper region (a) increases as it goes from center to edge of the substrate (W). The drying fluid is heated to a high temperature before it is injected into the confined upper region (a) so that the top surface of the substrate (W) can be rapidly dried. In the present invention, the top and bottom surfaces of the substrate (W) can be cleaned and dried at the same time. The bottom surface of the substrate (W) can be cleaned and dried by injecting the same cleaning and drying fluids as those injected onto the top surface of the substrate (W) through the nozzle 152 of the second nozzle member 150.

After the substrate (W) is dried, the upper cup 132 of the upper cover member 130 is lifted to a position shown in FIG. 2 to open the top of the low cover member 120 in operation S150. In operation S160, the chuck 112 and the nozzle 142 of the first nozzle member 140 are stopped, and the substrate (W) is unloaded from the chuck 112.

The present invention can be applied to any equipment that treats a substrate using a liquid (or gas) fluid. Although a rotary cleaning apparatus for a semiconductor cleaning process is exemplarily described in the current embodiment, the present invention can be applied to other apparatuses such as a rotary etching apparatus.

(Second Embodiment)

Figure 6:
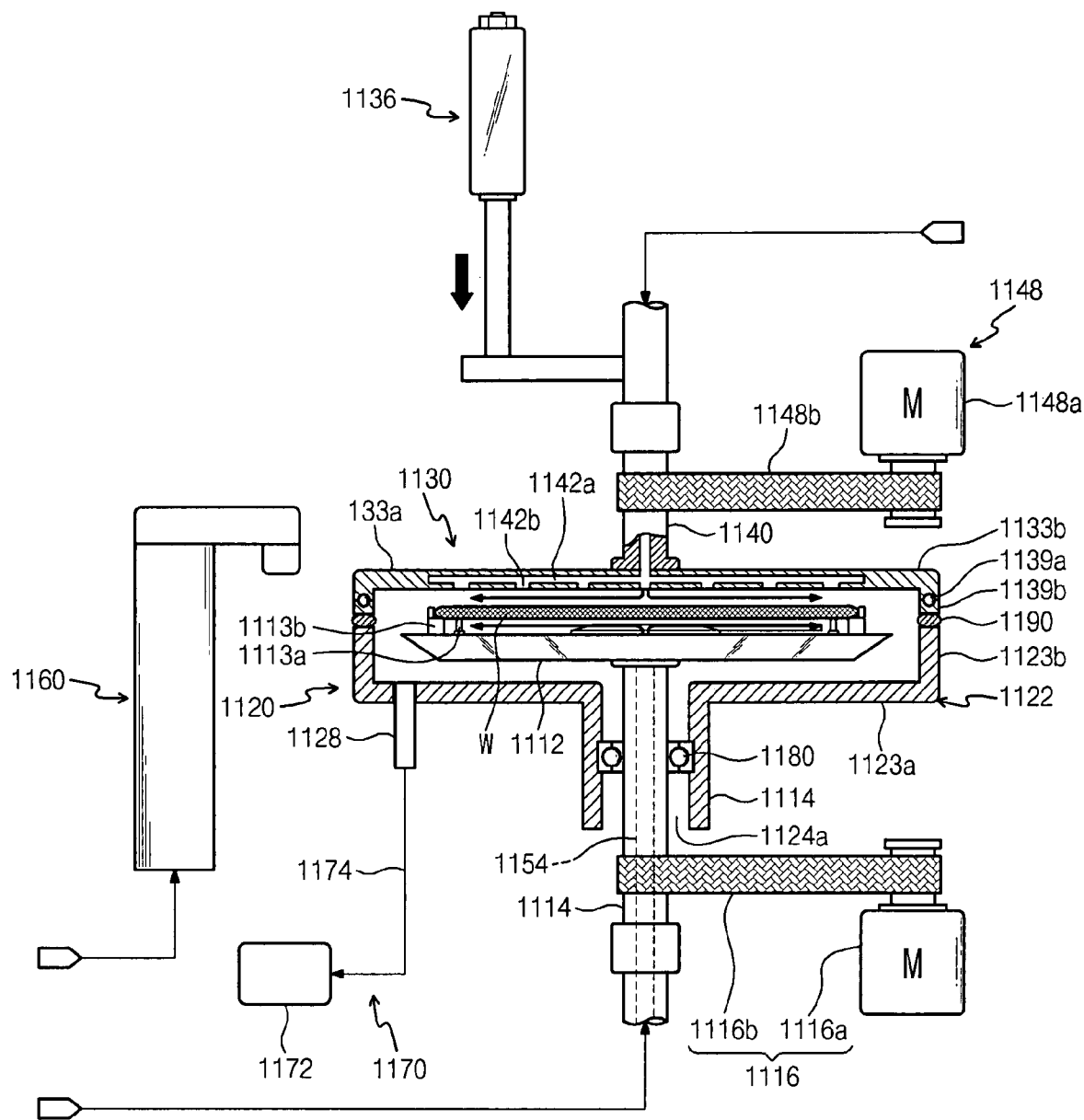
FIG. 6 is a schematic perspective view illustrating a substrate cleaning apparatus according to a second embodiment of the present invention.

FIG. 6 is a schematic perspective view illustrating a substrate cleaning apparatus 1100 in which an upper cover member is formed with a nozzle according to a second embodiment of the present invention.

Referring to FIG. 6, the substrate cleaning apparatus 1100 includes a substrate support member 1110 having a chuck 1112 to receive a substrate (W), a low cover member 1120, an upper cover member 1130, a second nozzle member 1150, a third nozzle member 1160, and a decompression unit 1170. These elements of the substrate cleaning apparatus 1100 have the same structures as those of the substrate cleaning apparatus 100. Thus, descriptions thereof will be omitted.

However, in the current embodiment, the upper cover member 1130 has a nozzle function for injecting a drying fluid onto a top surface of a substrate (W) in addition to a function for opening and closing an opened top of the low cover member 1120. The upper cover member 1130 includes an upper cup 1132, a lifting unit 1136, a spindle 1140, and a first rotation unit 1148.

The upper cup 1132 of the upper cover member 1130 is shaped like a bowl. The upper cup 1132 includes a top surface 1133a and a side surface 1133b. The top surface 133a is sufficiently large to cover the top of a low cup 1122 of the low cover member 1120, and the side surface 133b extends downward from the edge of the top surface 133a. The upper cup 1132 further includes a bearing 1139a at a sidewall and a ring-shaped fixing portion 1139b. The ring-shaped fixing portion 1139b makes contact with a sealing member 1190 installed at a side surface 1123b of the low cup 1122. That is, when the upper cup 1132 is coupled to the low cup 1122 to close the low cup 1122 and is rotated, the fixing portion 1139b can make contact with the sealing member 1190 without being rotated owing to the bearing 1139a.

Meanwhile, the upper cup 1132 further includes an internal fluid passage 1142a receiving a drying fluid from a fluid supplying unit, and a plurality of injection holes 1142b connected to the fluid passage 1142a for injecting the drying fluid onto the top surface of the substrate (W) for drying the substrate (W). The drying fluid is supplied to the fluid passage 1142a through a supply line (not shown). The injection holes 1142b are formed in the upper cup 1132 at regular intervals along an imaginary horizontal line running from center to edge of the substrate (W).

The spindle 1140 is coupled to a top center portion of the upper cup 1132. The spindle 1140 receives a rotation force from the first rotation unit 1148. The upper cup 1132 is rotated together with the spindle 1140. Here, the first rotation unit 1148 can include a driver 1148a such as a motor and a power transmitting member 1148b such as a belt and a chain. The power transmitting member 1148b transmits rotary power from the driver 1148a to the spindle 1140.

(Third Embodiment)

Figure 7:
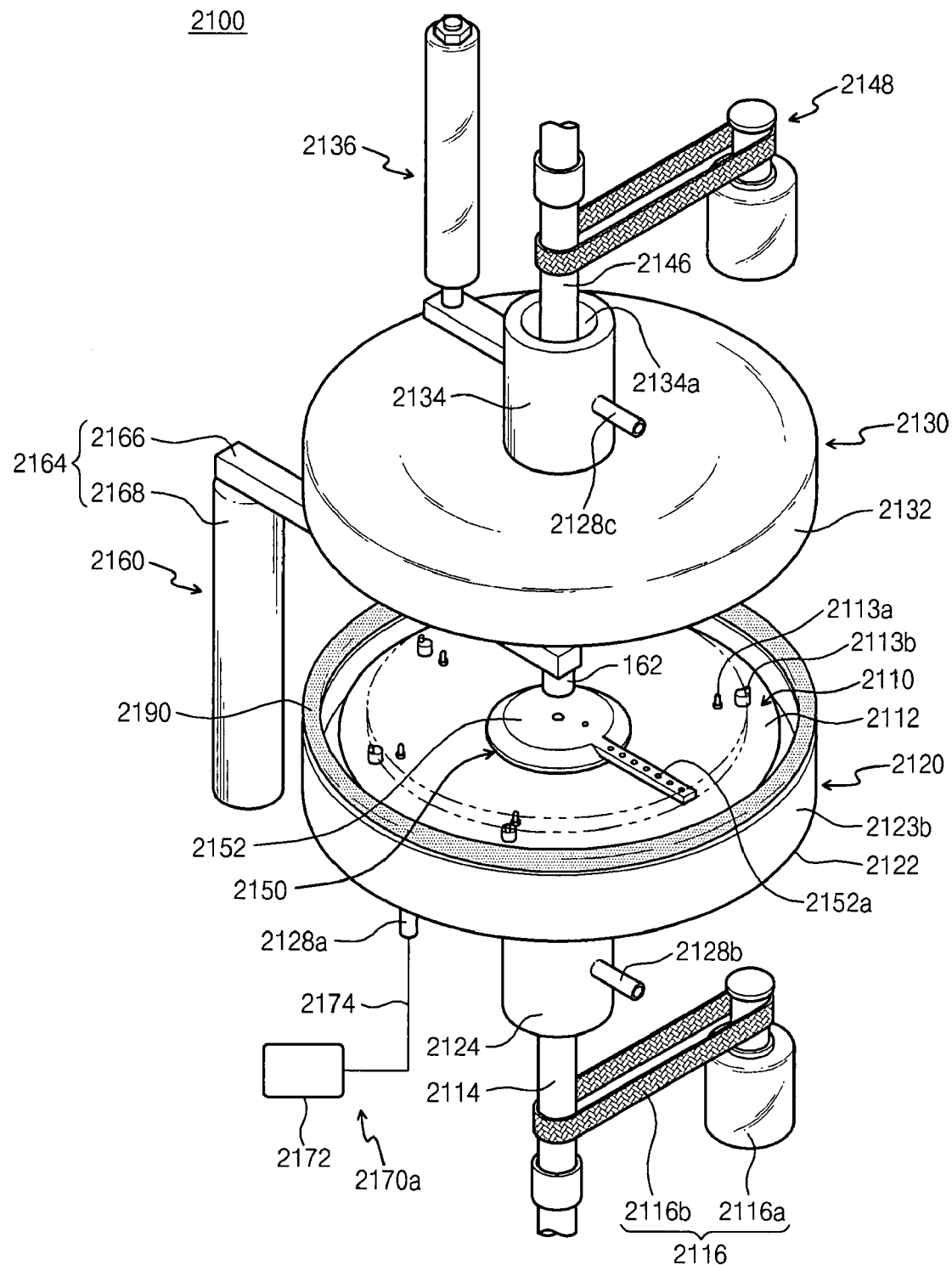
FIG. 7 is a schematic perspective view illustrating a substrate cleaning apparatus according to a third embodiment of the present invention.
Figure 8:
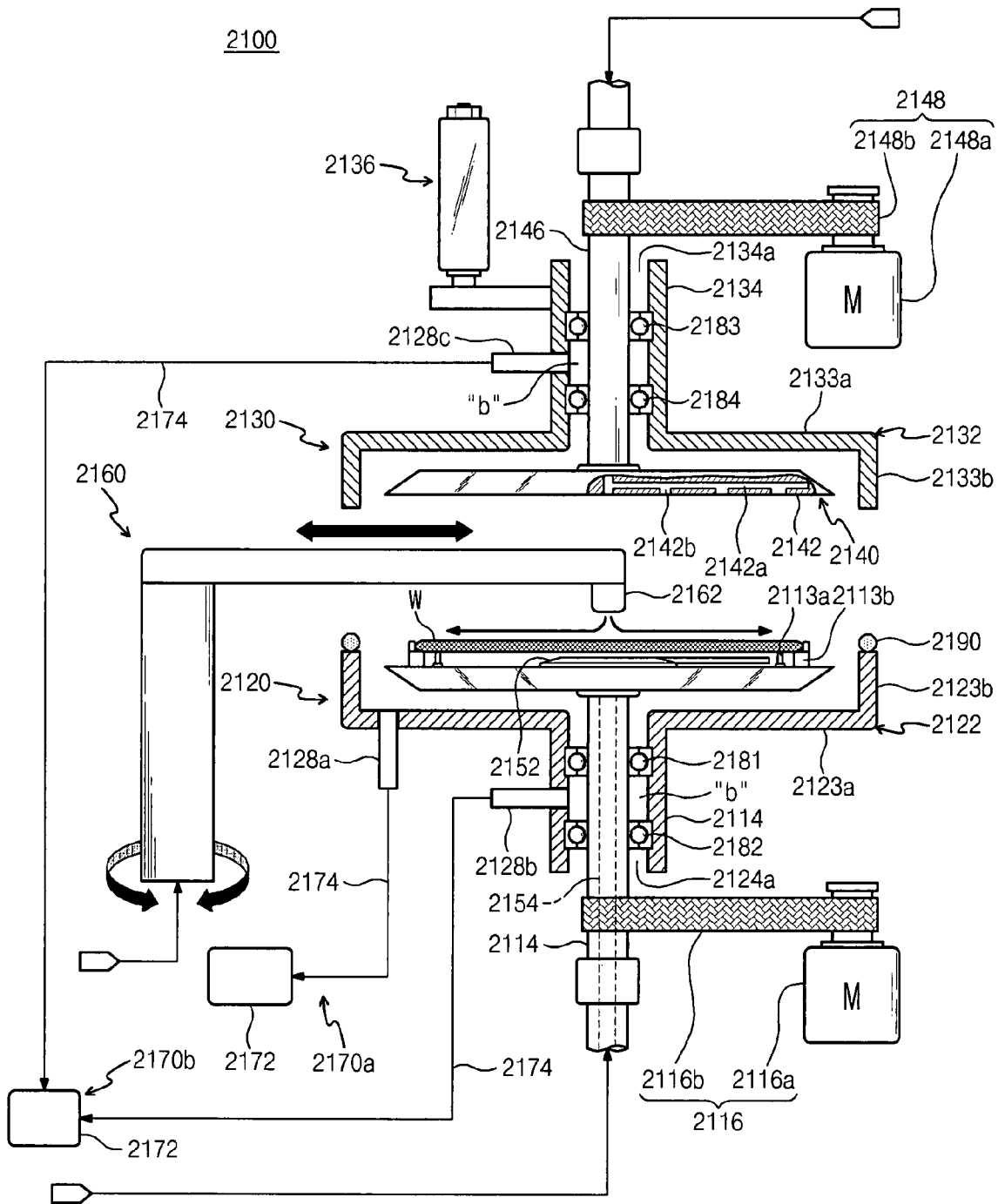
FIG. 8 illustrates the substrate cleaning apparatus when a low cover assembly of the substrate cleaning apparatus is opened according to the third embodiment of the present invention.
Figure 9:
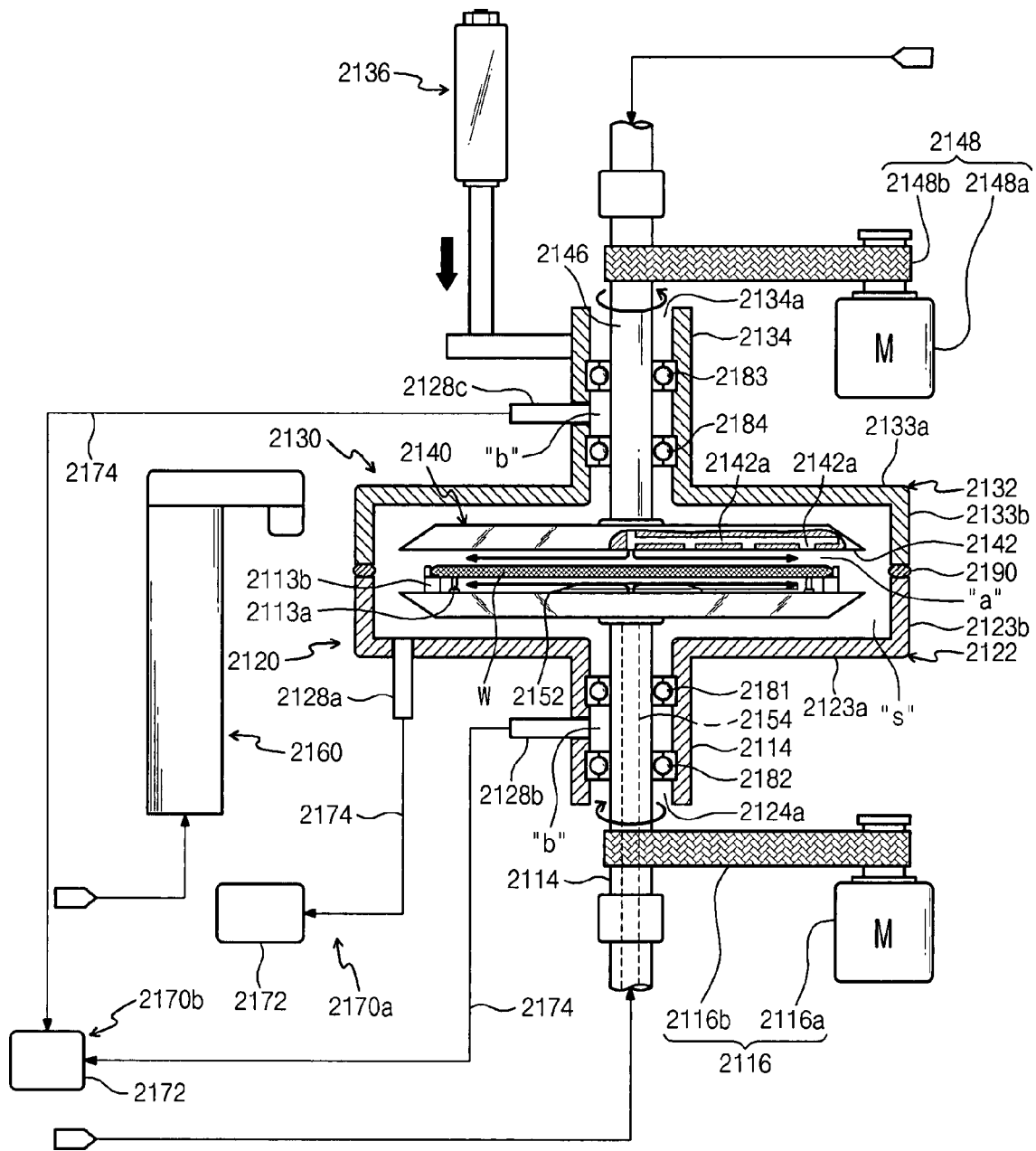
FIG. 9 illustrates the substrate cleaning apparatus when the low cover assembly is closed according to the third embodiment of the present invention.

FIG. 7 is a schematic perspective view illustrating a substrate cleaning apparatus 2100 according to a third embodiment of the present invention. FIG. 8 illustrates the substrate cleaning apparatus 2100 when a low cover assembly of the substrate cleaning apparatus is opened according to the third embodiment of the present invention. FIG. 9 illustrates the substrate cleaning apparatus 2100 when the low cover assembly is closed according to the third embodiment of the present invention.

Referring to FIGS. 7 through 9, the substrate cleaning apparatus 2100 performs chemical-cleaning, rinsing, and drying on a substrate (W) while spinning the substrate (W). The substrate cleaning apparatus 2100 includes: a substrate support member 2110 having a chuck 2112 to receive a substrate (W); a chamber formed by a low cover member 2120 and an upper cover member 2130; a first nozzle member 2140; a second nozzle member 2150; a third nozzle member 2160; and first and second decompression units 2170a and 2170b.

The substrate support member 2110 supports a substrate (W) when the substrate (W) is treated. The substrate support member 2110 includes the chuck 2112, a spindle 2114, and a second rotation unit 2116.

The chuck 2112 is disposed inside the low cover member 2120. The chuck 2112 includes a top surface receiving a substrate (W), support pins 2113a supporting the substrate (W) off the top surface, and chucking pins 2113b fixing the substrate (W). The support pins 2113a supports the substrate (W) and spaces the substrate (W) apart from the top surface of the chuck 2112, and the chucking pins 2113b holds the substrate (W) by the edge when the substrate (W) is treated.

The spindle 2114 of the substrate support member 2110 is coupled to a bottom center of the chuck 2112. The spindle 2114 is coupled to the chuck 2112 through a first spindle hole 2124a of an insertion port 2124 of the low cover member 2120 and receives rotary power from the second rotation unit 2116. The chuck 2112 is rotated by receive a rotary force from the second rotation unit 2116 through the spindle 2114.

The second rotation unit 2116 may include a driver 2116a such as a motor and a power transmitting member 2116b such as a belt and a chain transmitting rotary power from the driver 2116a to the spindle 2114.

The low cover member 2120 includes a low cup 2122 enclosing the chuck 2112 and having an opened top. The low cup 2122 is shaped like a bowl. The low cup 2122 includes a bottom surface 2123a and a side surface 2123b. The low cup 2122 further includes the insertion port 2124 and first and second vacuum ports 2128a and 2128b. The insertion port 2124 is protruded downward from the bottom surface 2123a of the low cup 2122 and formed with the first spindle hole 2124a. The first vacuum port 2128a is connected to a vacuum line 2174 of the first decompression unit 2170a, and the second vacuum port 2128b is connected to a vacuum line 2174 of the second decompression unit 2170b.

The spindle 2114 of the substrate support member 2110 passes through the first spindle hole 2124a of the insertion port 2124, and first and second bearings 2181 and 2182 are installed in the first spindle hole 2124a to rotatably support the spindle 2114 and hermetically seal the first spindle hole 2124a. That is, the first and second bearings 2181 and 2182 are used as sealing members as well as support members. A buffer space (b) is formed in the first spindle hole 2124a by the first and second bearings 2181 and 2182. The second vacuum port 2128b is formed at the insertion port 2124 in connection with the buffer space (b). The buffer space (b) is located between an outside area and a closed space (s) where a substrate (W) is treated. The buffer space (b) is decompressed by the second decompression unit 2170b. The buffer space (b) may be decompressed to a pressure lower than that of the closed space (s). Therefore, the buffer space (b) can prevent outside air from being introduced into the closed space (s) when a substrate (W) is treated in the closed space (s).

The low cover member 2120 may further include a discharge hole (not shown) to drain a chemical or other fluids.

The upper cover member 2130 includes an upper cup 2132 and a lifting unit 2136. The lifting unit 2136 lifts or moves down the upper cup 2132 to open or close the top of the low cover member 2120. The upper cup 2132 is shaped like a bowl. The upper cup 2132 includes a top surface 2133a and a side surface 2133b. The top surface 2133a is sufficiently large to cover the top of the low cup 2122, and the side surface 2133b extends downward from the edge of the top surface 2133a. The upper cup 2132 further includes an insertion port 2134. The insertion port 2134 is formed with a second spindle hole 2134a and a third vacuum port 2128c. The insertion port 2134 is protruded upward from the top surface 2133a. The side surface 2133b of the upper cup 2132 makes contact with the side surface 2123b of the low cup 2122 when the upper cup 2132 is moved down. A sealing member 2190 is attached to the side surface 2123b of the low cup 2122 to hermetically seal the closed space (s) formed by the upper and low cups 2132 and 2122 when a substrate (W) is treated.

A spindle 2146 of the first nozzle member 2140 passes through the second spindle hole 2134a of the insertion port 2134, third and fourth bearings 2183 and 2184 are installed in the second spindle hole 2134a to rotatably support the spindle 2146 and hermetically seal the second spindle hole 2134a. That is, the third and fourth bearings 2183 and 2184 are used as sealing members as well as support members. A buffer space (b) is formed in the second spindle hole 2134a by the third and fourth bearings 2183 and 2184, and the third vacuum port 2128c is formed at the insertion port 2134 in connection with the buffer space (b). The buffer space (b) is located between an outside area and the closed space (s) where a substrate (W) is treated. The buffer space (b) is decompressed by the second decompression unit 2170b. The buffer space (b) may be decompressed to a pressure lower than that of the closed space (s). Therefore, the buffer space (b) can prevent outside air from being introduced into the closed space (s) when a substrate (W) is treated in the closed space (s).

Generally, the sealing characteristics of a bearing are not so good and thus vacuum leakage can occur around the bearing. However, in the current embodiment of the present invention, two bearings are used, and the buffer space (b) formed by the bearings is decompressed to a pressure lower than that of the closed space (s). Therefore, the closed space (c) can be securely sealed.

The first decompression unit 2170a decompresses the closed space (s) formed by upper and low cups 2132 and 2122. The first decompression unit 2170a includes a vacuum pump 2172 and the vacuum line 2174. One end of the vacuum line 2174 is connected to the vacuum pump 2172, and the other end is connected to the first vacuum port 2128a of the low cover member 2120.

The second decompression unit 2170b decompresses the buffer spaces (b). The second decompression unit 2170b includes a vacuum pump 2172 and the vacuum lines 2174. One ends of the vacuum lines 2174 are connected to the vacuum pump 2172, and the other ends are connected to the second and third vacuum ports 2128b and 2128c.

The second decompression unit 2170b decompresses the buffer spaces (b) to a pressure lower than that of the closed space (s) in order to prevent outside air from being introduced into the closed space (s). The second decompression unit 2170b may decompress the buffer spaces (b) after the upper cover member 2130 is moved down to the lower cover member 2120 to form the closed space (s).

As explained above, the substrate cleaning apparatus 2100 of the present invention is characterized in that a substrate (W) can be treated in an isolated space (the closed space (s)) by closing the upper cover member 2130 and the closed space (s) can be decompressed to a pressure lower than the atmospheric pressure. Therefore, the substrate cleaning apparatus 2100 can rapidly dry a substrate while more effectively preventing the substrate (W) from being affected by environmental agents. Particularly, in the current embodiment, the buffer spaces (b) formed by the bearings are decompressed to a pressure lower than that of the closed space (s) where a substrate (W) is treated, such that the closed space (s) can be hermetically sealed from outside air.

Although not shown, the low cover member 2120 and the chuck 2112 of the substrate support member 2110 can be moved individually or relative to each other. In this case, a substrate (W) can be loaded on or unloaded from the chuck 2112 after moving the low cover member 2120 or the chuck 2112 to an appropriate position.

Referring to FIGS. 7 and 8, the third nozzle member 2160 is used to inject a cleaning fluid onto a top surface of a substrate (W). The third nozzle member 2160 includes a nozzle 2162. A nozzle moving member 2164 moves the nozzle 2162 vertically or rotates the nozzle 2162 from a center of a substrate (W) to the edge of the low cup 2122. The nozzle moving member 2164 includes a horizontal support member 2166 connected to the nozzle 2162 and a vertical support member 2168 connected to the horizontal support member 2166. The vertical Support member 2168 can be rotated by a motor (not shown).

Referring to FIGS. 8 and 9, the second nozzle member 2150 is used to selectively inject cleaning and drying fluids onto a bottom surface of a substrate (W). The third nozzle member 2150 includes a nozzle 2152 on the chuck 2112 and a supply line 2154 supplying a fluid to the nozzle 2152. The supply line 2154 is connected to the nozzle 2152 through the spindle 2114 of the substrate support member 2110. The nozzle 2152 includes a bar. The bar extends in a radial direction of the substrate (W) and includes a plurality of injection holes 2152a formed in a top surface.

Figure 10:
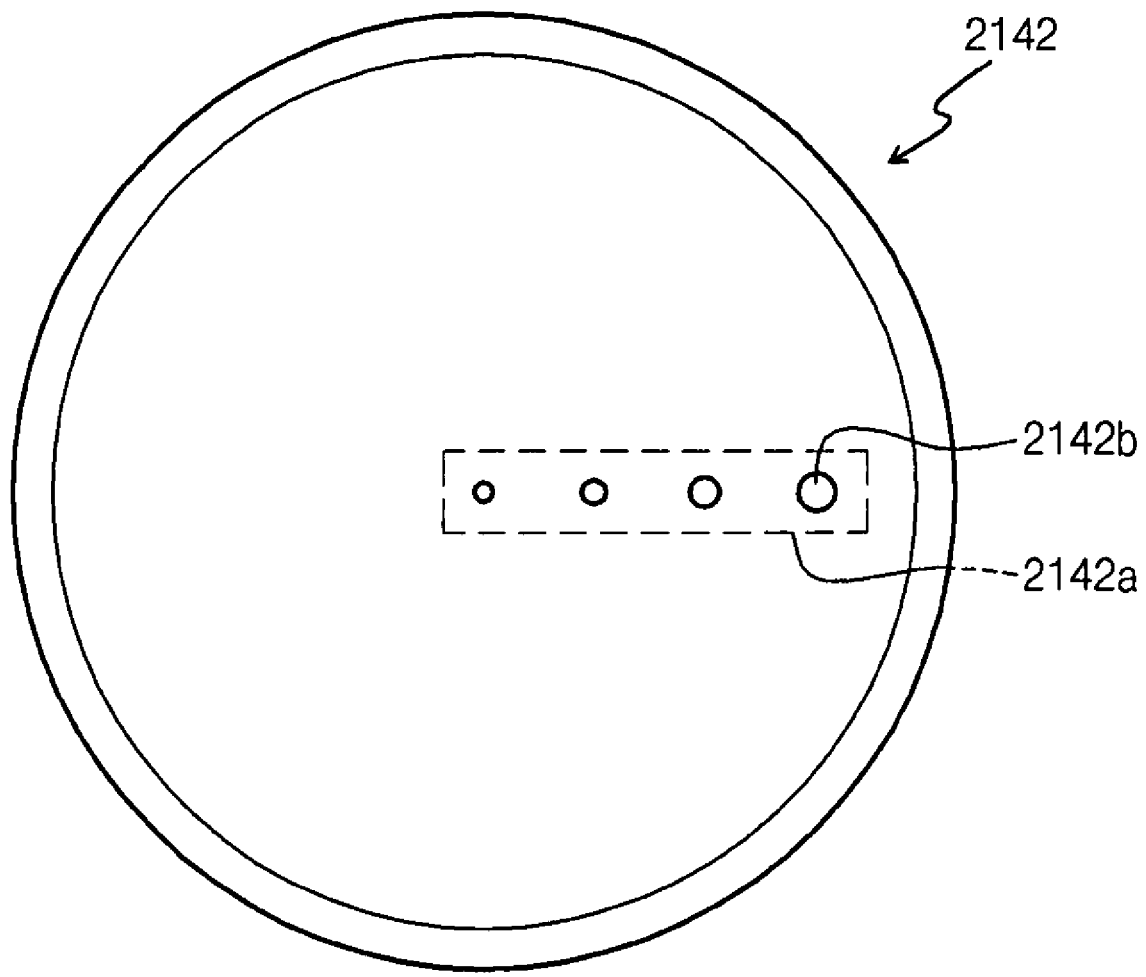
FIG. 10 illustrates injection holes formed in a nozzle of an upper cover assembly of the substrate cleaning apparatus according to the third embodiment of the present invention.

Referring to FIGS. 7 and 10, the first nozzle member 2140 is used to inject a fluid onto a top surface of a substrate (W) for drying the substrate (W). The first nozzle member 2140 includes a nozzle 2142, the spindle 2146, and a first rotation unit 2148.

The nozzle 2142 has a circular plate shape. The nozzle 2142 includes an internal fluid passage 2142a to receive a fluid from a fluid supplying unit for drying a substrate (W), and a plurality of injection holes 2142b connected to the fluid passage 2142a. A fluid for drying a substrate (W) is supplied to the fluid passage 2142a through a supply line (not shown) formed through the spindle 2146. The injection holes 2142b are formed in the nozzle 2142 at regular intervals along an imaginary horizontal line running from center to edge of a substrate (W). The hole area density of the injection holes 2142b may increase from the center to the edge of a substrate (W).

For this, the sizes of the injection holes 2142b can be increased from the center to the edge of a substrate (W) as shown in FIG. 10. Alternatively, the distance between the injection holes 2142b can be decreased as it goes from the center to the edge of a substrate (W). The drying fluid may include an organic solvent such as IPA and nitrogen gas. The organic solvent and nitrogen gas can be heated to a temperature of 30° C. to 90° C. for being used as the drying fluid.

In the first nozzle member 2140, the spindle 2146 is coupled to a top center portion of the nozzle 2142. The spindle 2146 is coupled to the nozzle 2142 through the second spindle hole 2134a of the upper cover member 2130. The spindle 2146 receives rotary power from the external first rotation unit 2148. The nozzle 2142 injects a drying fluid onto a top surface of a substrate (W) while being rotated by rotary power transmitted from the first rotation unit 2148 through the spindle 2146.

The first rotation unit 2148 is constructed to rotate the nozzle 2142. The first rotation unit 2148 includes a driver 2148a such as a motor and a power transmitting member 2148b such as a belt and a chain. The power transmitting member 2148b transmits rotary power from the driver 2148a to the spindle 2146. The first rotation unit 2148 can rotate the nozzle 2142 of the first nozzle member 2140 at a speed different from the rotation speed of the chuck 2112.

As shown in FIG. 8, the nozzle 2142 of the first nozzle member 2140 may be spaced apart from a top surface of a substrate (W) by 0.1 mm to 10 mm when the substrate (W) is dried. When the nozzle 2142 of the first nozzle member 2140 is placed closer to the top surface of the substrate (W), the substrate (W) can be cleaned and dried more efficiently by the capillary phenomenon. However, when the nozzle 2142 is spaced apart from the top surface of the substrate (W) by less than 0.1 mm, the substrate (W) can be scratched by the nozzle 2142 because of tolerance accumulation of parts and bending of the substrate (W). On the other hand, when the nozzle 2142 is spaced apart from the top surface of the substrate (W) by more than 10 mm, the substrate (W) is not efficiently dried.

As explained above, in the substrate cleaning apparatus 2100, the nozzle 2142 of the first nozzle member 2140 forms a confined upper region (a) above a substrate (W) loaded on the chuck 2112. When a heated drying fluid is supplied to the top surface of the substrate (W) through the confined upper region (a), the temperature of the drying fluid is not readily decreased. Particularly, since the heated drying fluid is supplied to many points of the substrate (W) through the plurality of injection holes 2142b, the substrate (W) can be dried more rapidly and efficiently. Meanwhile, although a small amount of heated drying fluid including an organic solvent is supplied to the top surface of the substrate (W), the organic solvent can be distributed densely and uniformly throughout the confined upper region (a), thereby ensuring sufficient drying efficiency.

Furthermore, the velocity of drying fluid in the confined upper region (a), which is proportional to the rotation speeds of the nozzle 2142 of the first nozzle member 2140 and the substrate (W), can be further increased since the confined upper region (a) is narrow. Therefore, foreign particles and water remaining on the substrate (W) can be removed more efficiently.

As mentioned above, in the substrate cleaning apparatus 2100, the number of injection holes and the kind of drying fluid can be varied according to the method of cleaning and drying a substrate. Furthermore, the distance between the injection holes can be varied according to the substrate cleaning and drying method. For example, a mixture of deionized water and a hydrofluoric solution, or a mixture of deionized water, an ammonia solution, and a peroxide solution can be used as a cleaning fluid in the substrate cleaning apparatus 2100, and a mixture of iso propyl alcohol vapor and nitrogen gas, or nitrogen gas can be used as a drying fluid in the substrate cleaning apparatus 2100.

A method of cleaning substrate using the substrate cleaning apparatus 2100 will now be described.

Figure 11:
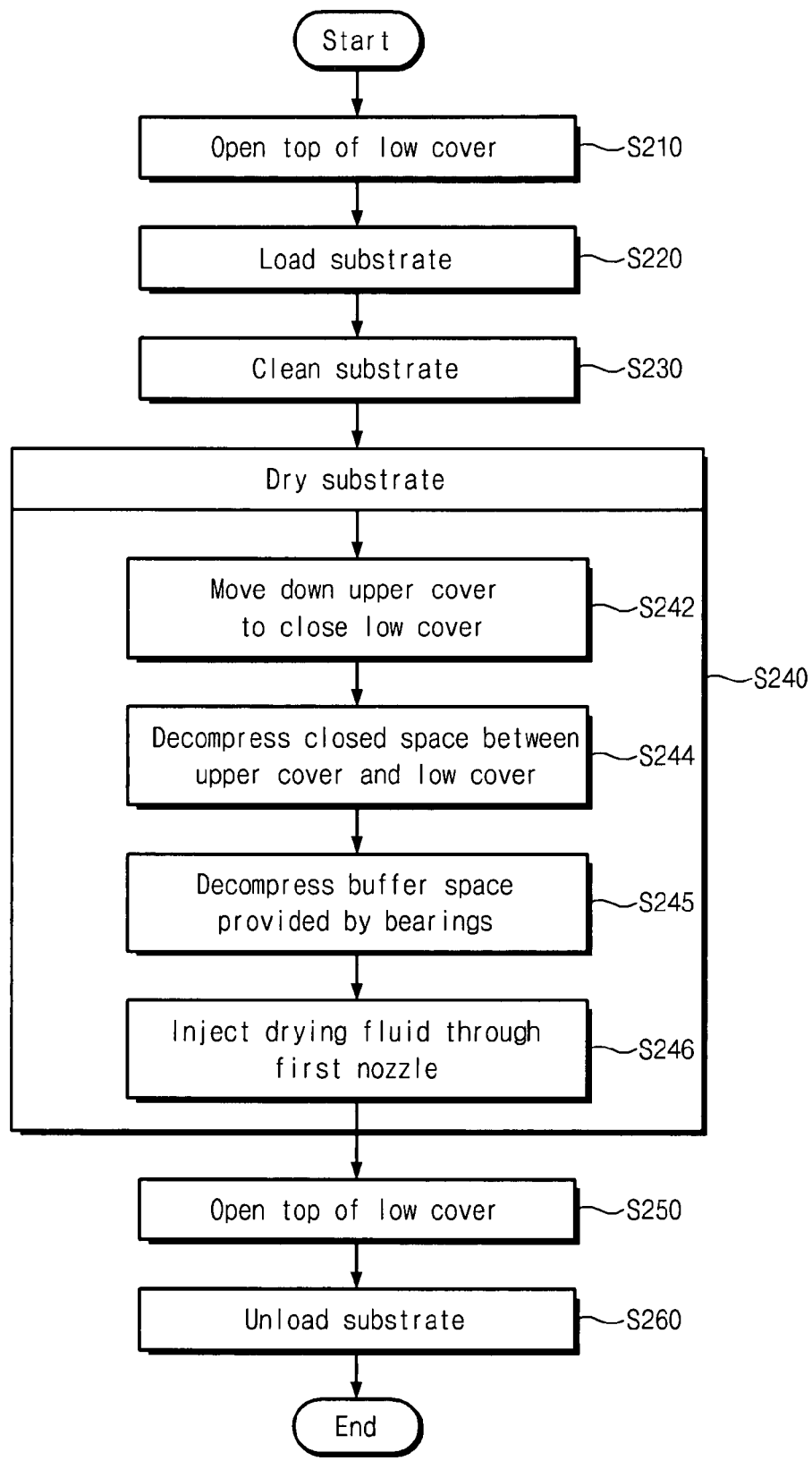
FIG. 11 is a flowchart for explaining a substrate cleaning method according the third embodiment of the present invention.

FIG. 11 is a flowchart for explaining a substrate cleaning method according the third embodiment of the present invention.

Referring to FIGS. 8, 9, and 11, a substrate (W) is loaded on the chuck 2112 from the opened top of the low cover member 2120 in operations S210 and S220. The substrate (W) is supported by the support pins 2113a and chucked by the chucking pins 2113b. The substrate (W) is rotated together with the chuck 2112 by the second rotation unit 2116. In operation S230, while the substrate (W) is rotated, a fluid is injected from the nozzle 2162 of the third nozzle member 2160 onto the substrate (W) to clean and rinse the substrate (W) (refer to FIG. 8).

After that, the substrate (W) is dried in operation S240. The substrate (W) is rapidly dried at a pressure lower than the atmospheric pressure to prevent formation of a water spot on the substrate (W).

In detail, the drying operation S240 is performed as follows. In sub-operation S242, the upper cup 2132 of the upper cover member 2130 is moved down to a position shown in FIG. 9 to close the opened top of the low cover member 2120. In sub-operation S244, the first decompression unit 2170a decompresses the closed space (s) formed by the low cover member 2120 and the upper cover member 2130 to a pressure lower than the atmospheric pressure. In sub-operation S245, the second decompression unit 2170b decompresses the buffer spaces (b) formed in the first and second spindle holes 2124a and 2134a to a pressure lower than that of the closed space (s). In sub-operation S246, the substrate (W) is dried by injecting a dry fluid to the substrate (W) through the nozzle 2142 of the first nozzle member 2140. Here, the drying fluid is injected to the confined upper region (a) from the nozzle 2142 while rotating the nozzle 2142. In detail, while the nozzle 2142 is rotated by the first rotation unit 2148, the drying fluid is injected from the nozzle 2142 toward the top surface of the substrate (W). Thus, the drying fluid can be rapidly spread to the edge of the substrate (W) by the centrifugal force. When the drying fluid is injected to the substrate (W), the chuck 2112 and the nozzle 2142 of the first nozzle member 2140 can be rotated at different speeds (alternatively, only one of the chuck 2112 and the nozzle 2142 can be rotated). The amount of the drying fluid injected into the confined upper region (a) increases as it goes from center to edge of the substrate (W). The drying fluid is heated to a high temperature before it is injected into the confined upper region (a) so that the top surface of the substrate (W) can be rapidly dried. In the present invention, the top and bottom surfaces of the substrate (W) can be cleaned and dried at the same time. The bottom surface of the substrate (W) can be cleaned and dried by injecting the same cleaning and drying fluids as those injected onto the top surface of the substrate (W) through the nozzle 2152 of the second nozzle member 2150.

After the substrate (W) is dried, the upper cup 2132 of the upper cover member 2130 is lifted to a position shown in FIG. 8 to open the top of the low cover member 2120 in operation S250. In operation S260, the chuck 2112 and the nozzle 2142 of the first nozzle member 2140 are stopped, and the substrate (W) is unloaded from the chuck 2112.

As described above, according to the present invention, substrates can be rapidly dried. Furthermore, in a drying process, a substrate can be effectively protected from external pollutants. Furthermore, in a drying process, formation of a water spot on a substrate can be effectively prevented. Furthermore, in a drying process, a substrate can be effectively protected from being affected by environmental agents. Furthermore, a substrate can be prevented from making contact with air during a process. In addition, in a drying process, a drying fluid can be supplied to a substrate at a constant density and temperature. Moreover, outside air cannot be introduced into a space where a substrate is treated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for cleaning a substrate, comprising:
a substrate support member including a rotatable chuck configured for receiving a substrate and rotating at a first speed;
a first nozzle member configured for injecting a drying fluid onto a top surface of the substrate for drying the substrate and rotating at a second speed that is different than the first speed of the rotatable chuck;
a low cover comprising a bottom surface, a side surface, and an opened top, the chuck being enclosed by the bottom surface and the side surface of the low cover; an upper cover movable with respect to the low cover for selectively covering the opened top and sealing against the side surface of the low cover;
an isolated space disposed between the low cover and the upper cover for providing a closed space in which the substrate is treated, wherein the isolated space is sealed from the outside atmosphere and decompressed to a different pressure than a pressure of the outside atmosphere for drying of the substrate; and
a control unit configured to control rotation of the rotatable chuck and the first nozzle member at different speeds at the same time;
wherein the first nozzle member is installed to the upper cover.

2. The apparatus of claim 1, further comprising a first rotation unit for rotating the first nozzle member.

3. The apparatus of claim 2, wherein the first nozzle member comprises a nozzle including a plurality of injection holes arranged along a horizontal line running from center to edge of the substrate.

4. The apparatus of claim 1, further comprising a lifting unit for moving the upper cover to or away from the low cover for closing or opening the opened top of the low cover.

5. The apparatus of claim 1, wherein the first nozzle member comprises a nozzle that includes an injection hole and is disposed in the closed space above the substrate.

6. The apparatus of claim 5, further comprising a first rotation unit for rotating the first nozzle member.

7. The apparatus of claim 1, further comprising a first rotation unit for rotating the upper cover.

8. The apparatus of claim 5, wherein the nozzle includes a plurality of injection holes arranged along a horizontal line running from center to edge of the substrate.

9. The apparatus of claim 8, wherein hole area density of the injection holes increases in a direction from the center to the edge of the substrate.

10. The apparatus of claim 1, wherein the chuck comprises support members that support the substrate and space the substrate apart from a top surface of the chuck.

11. The apparatus of claim 10, further comprising a second nozzle member installed at the chuck for injecting a fluid onto a bottom surface of the substrate.

12. The apparatus of claim 1, wherein the substrate support member further includes a second rotation unit for rotating the chuck.

13. The apparatus of claim 1, wherein the drying fluid comprises an organic solvent and nitrogen gas.

14. The apparatus of claim 1, further comprising a decompression unit for decompressing the closed space formed by the low cover and the upper cover.

15. The apparatus of claim 1, further comprising a cleaning nozzle spaced from the upper cover and the low cover, the cleaning nozzle being moveable from a first position outside of the closed space to a second position facing the substrate received on the substrate support member, and the cleaning nozzle being configured for supplying cleaning fluid to the substrate.

16. An apparatus for cleaning a substrate, comprising:
a substrate support member including a rotatable chuck and a first spindle configured for supporting the chuck, wherein the rotatable chuck is configured for receiving a substrate and rotating the substrate at a first speed;
a first nozzle member including a nozzle formed with an injection hole for injecting a drying fluid onto a top surface of the substrate for drying the substrate,
a control unit; and
an isolated chamber providing a closed space in which the chuck is placed, wherein the isolated chamber is sealed from the outside atmosphere and decompressed to a different pressure than a pressure of the outside atmosphere for drying of the substrate, and wherein the chamber comprises:
a low cover having a bottom surface including a first spindle hole through which the first spindle passes, a side surface, and an opened top;
a rotatable upper cover movable with respect to the low cover for selectively covering the opened top and sealing against the side surface of the low cover so as to treat the substrate in the closed space, wherein the rotatable upper cover rotates over a bearing such that the upper cover rotates independently above the low cover at a second speed that is different from the first speed;
a cleaning nozzle spaced from the upper cover and the low cover, the cleaning nozzle being moveable from a first position outside of the chamber to a second position facing the substrate received on the substrate support member, and the cleaning nozzle being configured for supplying cleaning fluid to the substrate; and
a decompression unit at least partially disposed in the chamber for decompressing the isolated chamber;
wherein the first nozzle member is installed to the rotatable upper cover;
wherein the chamber includes first and second sealing members installed at different heights so as to form a buffer space between the spindle and the first spindle hole; and
wherein the control unit is configured to control rotation of the rotatable chuck and the rotatable upper cover at different speeds at the same time.

17. The apparatus of claim 16, further comprising:
a second decompression unit decompressing the buffer space formed between the first and second sealing members to a second pressure lower than the atmospheric pressure.

18. The apparatus of claim 17, wherein the second pressure of the buffer space is lower than the first pressure of the closed space so as to prevent outside air from being introduced into the closed space.

19. The apparatus of claim 17, wherein the first and second sealing members are bearings.

20. The apparatus of claim 16, further comprising a lifting unit moving the upper cover for opening or closing the opened top of the low cover.

21. The apparatus of claim 16, the first nozzle member further comprising a second spindle wherein the nozzle is supported by the second spindle,
wherein the nozzle is disposed in the closed space above the substrate, and
wherein the chamber further includes:
a second spindle hole through which the spindle of the first nozzle member passes; and
third and fourth sealing members installed at different heights to provide a sealing of a space between the spindle of the first nozzle member and the second spindle hole.

22. An apparatus for cleaning a substrate, comprising:
a substrate support member including a chuck configured for receiving a substrate and a first spindle supporting the chuck, wherein the first spindle rotates at a first speed;
a first nozzle member including a nozzle configured for injecting a drying fluid onto a top surface of the substrate for drying the substrate and a second spindle configured for supporting the nozzle, wherein the second spindle rotates at a second speed that is different than the first speed;
a low cover comprising a bottom surface, a side surface, and an opened top, the chuck being enclosed by the bottom surface and the side surface of the low cover; an upper cover movable with respect to the low cover for selectively covering the opened top and sealing against the side surface of the low cover so as to dry the substrate in a closed space, wherein the closed space is sealed from the outside atmosphere and decompressed to a different pressure than a pressure of the outside atmosphere for drying of the substrate; and
a decompression unit for decompressing the closed space formed by the low cover and the upper cover; and
a control unit configured to control rotation of the first and second spindles at different speeds at the same time;
wherein the low cover includes a first spindle hole through which the first spindle of the substrate support member passes and first and second sealing members installed at different heights to provide a sealing of a space between the spindle of the substrate support member and the first spindle hole; and
wherein the first nozzle is installed to the upper cover and wherein the upper cover includes a second spindle hole through which the second spindle of the first nozzle member passes and third and fourth sealing members installed at different heights to provide dual sealing for a space between the spindle of the first nozzle member and the second spindle hole.

23. The apparatus of claim 22, wherein the decompression unit decompresses the closed space to a first pressure lower than the atmospheric pressure, the apparatus further comprising another decompression unit decompressing a buffer space formed between the first and second sealing members and a buffer space formed between the third and fourth sealing members to a second pressure lower than the atmospheric pressure.

24. The apparatus of claim 23, wherein the second pressure of the buffer spaces is lower than the first pressure of the closed space so as to prevent outside air from being introduced into the closed space.

25. The apparatus of claim 22, further comprising a cleaning nozzle spaced from the upper cover and the low cover, the cleaning nozzle being moveable from a first position outside of the closed space to a second position facing the substrate received on the substrate support member, and the cleaning nozzle being configured for supplying cleaning fluid to the substrate.

26. An apparatus for cleaning a substrate, comprising:
a chamber providing a closed space that is sealed from the outside atmosphere, the chamber comprising:
a low cover having a bottom surface including a first spindle hole, a side surface, and an opened top; and
an upper cover movable with respect to the low cover for selectively covering the opened top and sealing against the side surface of the low cover, the upper cover including a second spindle hole;
a first nozzle member installed at the upper cover through the first spindle hole, wherein the first nozzle member rotates at a first speed;
a substrate support member installed at the low cover through the second spindle hole, wherein the substrate support member rotates at a second speed that is different from the first speed;
first and second sealing members forming a buffer space by dually sealing a space between the substrate support member and the second spindle hole;

third and fourth sealing members forming a buffer space by dually sealing a space between the first nozzle member and the first spindle hole; and a decompression unit at least partially disposed in the chamber for adjusting pressures of the closed space during drying of the substrate and buffer spaces to different levels so as to prevent outside air from being introduced into the closed space;

a cleaning nozzle spaced from the upper cover and the low cover, the cleaning nozzle being moveable from a first position outside of the chamber to a second position facing a substrate received on the substrate support member, and the cleaning nozzle being configured for supplying cleaning fluid to the substrate; and a control unit configured to control rotation of the first nozzle member and the substrate support member at different speeds at the same time.

27. The apparatus of claim 26, wherein the pressures of the buffer spaces are adjusted to be lower than that of the closed space.

* * * * *